DOUBLE DEPOSITIONS OF $BBR_3$ IN SILICON

Filed Nov. 22, 1967

INVENTORS
HUGH M. BOHNE
BY CECIL B. SHELTON
ATTORNEY

United States Patent Office 3,542,609

Patented Nov. 24, 1970

3,542,609

DOUBLE DEPOSITIONS OF $BBR_3$ IN SILICON

Hugh M. Bohne, Shrewsbury, Mass., and Cecil B. Shelton, North Palm Beach, Fla., assignors to International Telephone and Telegraph Corporation, Nutley, N.J., a corporation of Delaware Filed Nov. 22, 1967, Ser. No. 685,060
Int. Cl. H01l 7/36, 7/44
U.S. Cl. 148—188 5 Claims

ABSTRACT OF THE DISCLOSURE

An improvement in the vapor-solid diffusion process of providing a boron impurity distribution in silicon. The conventional process employs a boron compound such as e.g., boron tribromide to react with oxygen so as to form a borosilicate glaze on the surface of the silicon body into which the boron is to be diffused. The slice is subsequently heated to diffuse boron from the glaze into the silicon body. The improvement involves the combination of doping silicon from boro-silicate glass formations and doping silicon from outgassing surfaces to prevent the boron from reacting with silicon to produce objectionable silicon-boron compounds.

BACKGROUND OF THE INVENTION

Figure 1A:
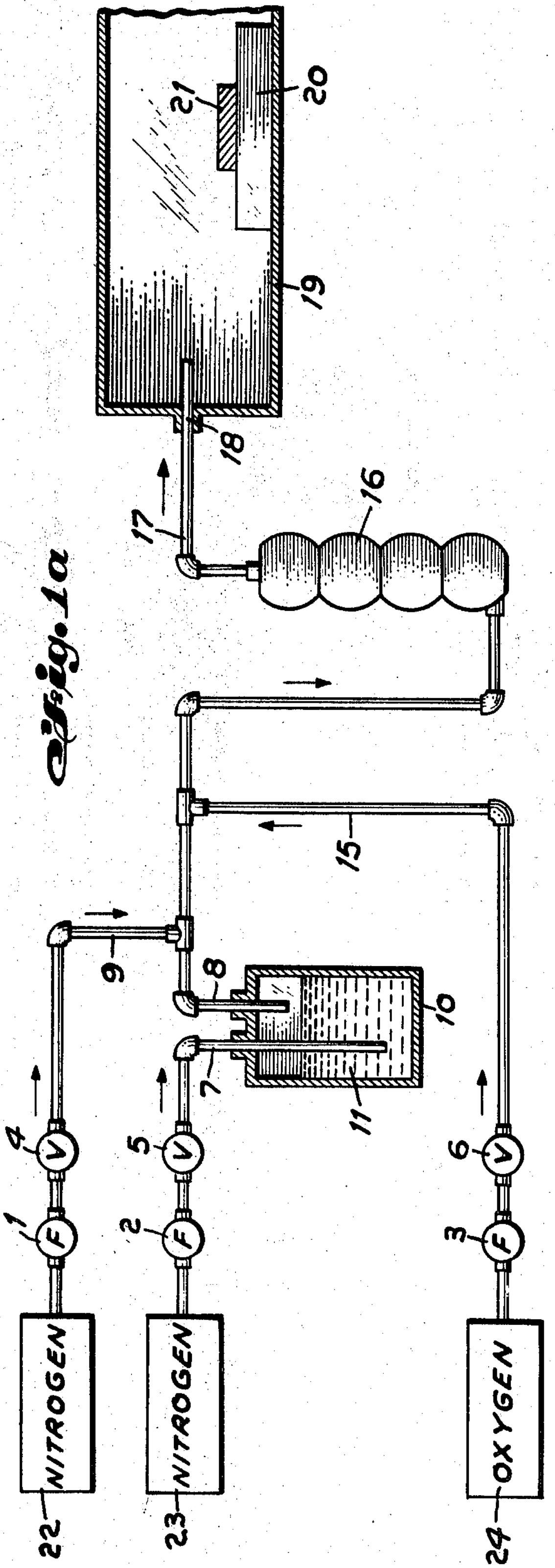

This invention relates to techniques for improving vapor-solid diffusion processes in which boron in employed as the conductivity-type-determining impurity material, and more particularly to a method for a two-step impurity introduction to prevent the formation of objectionable compounds of boron during the practice of such a process.

Techniques for varying the conductivity and/or conductivity type of a silicon semiconductor body by diffusion of a suitable impurity into said body are well known in the art. In particular, vapor-solid diffusion techniques have gained wide acceptance for the production of relatively high surface impurity concentrations; good uniformity and reproducibility of such concentrations has been realized by the use of such techniques. Generally, vapor-solid diffusion involves the deposition of a dopant-containing glass on the surface of the silicon body to be processed. The glass contains trapped impurity atoms which are diffused into the semiconductor surface during a subsequent heat treatment step.

Where the use of a P type impurity for doping a silicon semiconductor body is desired and a high impurity concentration at the silicon surface is required, boron is generally used as the impurity element. At the high temperatures required for the formation of the borosilicate glaze which serves as the impurity source during the subsequent diffusion "drive-in" step, the boron tends to react directly with the silicon to produce silicon-boron compounds which stain the slice surface and are difficult to remove. In particular, boron hexa-silicide is a commonly formed compound of this type. This compound seems to be insoluble in any solvent that will not dissolve silicon, and so must generally be removed by mechanical methods. Any such mechanical methods, such as lapping, result in removal of a surface layer of the silicon, thus raising the minimum sheet resistivity obtainable by such a vapor-solid diffusion technique.

Accordingly, an object of the present invention is to provide an improved process for the vapor-solid diffusion of boron in silicon.

Another object of the invention is to prevent the formation of undesirable silicon-boron compounds during such a vapor-solid diffusion process by introducing an outgas technique to change diffusion from impurity atom limitation conditions to solubility conditions with unlimited impurity atoms availability.

SUMMARY

The present invention provides an improved process for the vapor-solid diffusion of boron in silicon by introducing boron impurity in a reducing atmosphere into the reaction chamber and raising the temperature therein to increase the solubility of boron in silicon from borosilicate glass previously formed and preventing the formation of undesired boron-silicon compounds. The quartz tube of the reaction chamber is used as an impermeable surface for additional boron tribromide disassociation to take place, said additional boron atoms being used to replenish depleted borosilicate glass film.

In the drawing:

FIGS. *1a* and *1b* show a flow diagram of apparatus employed in practicing the novel process of the invention.

DETAILED DESCRIPTION

In cases where a high concentration of acceptor impurities is desired in a silicon semiconductor body, i.e. where it is desired to form a region in the body having P+ type conductivity, boron is commonly used as the active impurity material. Generally a gaseous compound of boron, preferably a boron halide or a boron hydride such as diborane, is mixed with oxygen or another oxygen-containing compound and passed over the surface of the silicon slice to be processed. The silicon slice is maintained at a temperature sufficiently high to cause reaction of the gaseous components to produce a borosilicate glaze ($SiO_2 \cdot B_2O_3$) on the silicon surface having a high but accurately controlled solid solubility of boron in silicon, generally on the order of $10^{20}$ atoms of boron per $cm.^3$ of borosilicate glaze. The glaze coated silicon slice is subsequently heated at an elevated temperature, generally on the order of 1250° C. to "drive-in" boron atoms from the borosilicate glaze into the silicon body to obtain the desired impurity concentration and distribution.

In practicing such a vapor-solid diffusion process, it has been found that staining of the silicon slice occurs during the deposition of the borosilicate glaze. The stains so formed are very difficult to remove and interfere with the formation of metallic contacts to the semiconductor body after the diffusion step has been completed. These stains have been found to include a reaction product of boron and silicon, typically boron hexa-silicide, as well as other undesirable reaction products due to other substances present during the glaze deposition process.

For the sake of specificity the following discussion will be directed to the utilization of boron tribromide as the gaseous boron compound used to form the borosilicate glaze. However, it should be kept in mind that similar effects occur with other halides of boron as well as with boron hydrides such as diborane, and that the invention is applicable to processes utilizing these boron compounds as well as those processes which employ boron tribromide.

In utilizing boron tribromide for the dopant source in the vapor-solid diffusion process, nitrogen is first saturated with boron tribromide by bubbling the nitrogen through a liquid solution of the boron tribromide. The saturated nitrogen is mixed with oxygen and introduced into the hot zone of the deposition furnace. The temperature of the silicon slice in the furnace is maintained sufficiently high to cause dissociation of the boron tribromide gas and subsequent reaction at the silicon surface in the presence of the oxygen to produce the desired borosilicate glaze deposit. The borosilicate glaze traps and holds boron carriers thus providing an accurately controlled surface impurity concentration for the subsequent diffusion step which comprises heating the silicon slice at a sufficiently high temperature and for a sufficiently long time to diffuse the trapped boron carriers from the glaze into the silicon body to the desired extent.

The primary reactions involved in formation of the borosilicate glaze are as follows:

$$4\ BBr_3+3O_2 \rightarrow 6\ Br_2+2B_2O_3 \quad (1)$$

$$B_2O_3+Si+O_2 \rightarrow B_2O_3 \cdot SiO_2 \quad (2)$$

Equations 1 and 2 depict the ideal situation for borosilicate glaze formation. Unfortunately, however, boron tribromide has a tendency to dissociate thus liberating free boron and free bromine. The bromine and boron compounds each can react with the silicon to produce undesired precipitates which stain the slice surface. Reactions which may be involved are set forth in equations 3–5 below:

$$2BBr_3 \rightarrow 2B+3Br_2 \quad (3)$$

$$6B+Si \rightarrow SiB_6 \quad (4)$$

$$2Br_2+Si \rightarrow SiBr_4 \quad (5)$$

The staining effects occur primarily at slice surface temperatures above 1090° C. The stains produce dark brown, black and gold brown hues across the exposed silicon surface in addition to a rich blue hue attributed to the borosilicate glaze. Comparing these stains with the physical characteristics of the reactants, boron hexasilicide has a black color characteristic while bromine has a gold-brown color characteristic. Accordingly, it is apparent that both silicon-boron and silicon-bromine compounds are probably formed by the reaction of the dissociation constituents of the boron tribromide gas with the silicon surface.

Another stain produced when the concentration of free boron is high is the result of a reaction with oxygen to produce a suboxide of boron, believed to be $B_6O$ or $B_7O$. This suboxide causes a "brown skin" formation on the silicon surface.

It has been found that the aforesaid staining effects can be substantially reduced or eliminated by first introducing boron impurity to silicon wafers at a temperature of 1020° C. The surface concentration is controlled by the amount of borosilicate glass produced. At this temperature minimal side reactions influence the silicon surface. A second step uses the quartz furnace tube as an impermeable surface for boron tribromide dissociation to take place. Silicon wafers are then placed into the quartz tube in a reducing (hydrogen) atmosphere where boron from the impermeable surface is supplied to the borosilicate glass previously formed. The temperature for this step is 1200° C. Under these conditions the diffusant atmosphere maintains solid solubility at the silicon surface for the 1200° C. temperature. It is known to use the techniques, separately, of (1) doping silicon from borosilicate glass formations, and (2) doping silicon from outgassing surfaces. However by combining these two techniques in the novel process of this invention it was found that vastly improved and unexpected results were obtained that neither technique can produce separately, that the use of the outgas technique changes diffusion from diffusant limitation to solubility conditions and improvement of the impermeable surface outgas technique by shortening the time required to dope the surface. The time for repeatable results with this invention is 15 minutes compared to several hours from outgas technique alone. Lastly, this invention minimizes or reduces any chance for stain on the silicon surface.

Figure 1B:
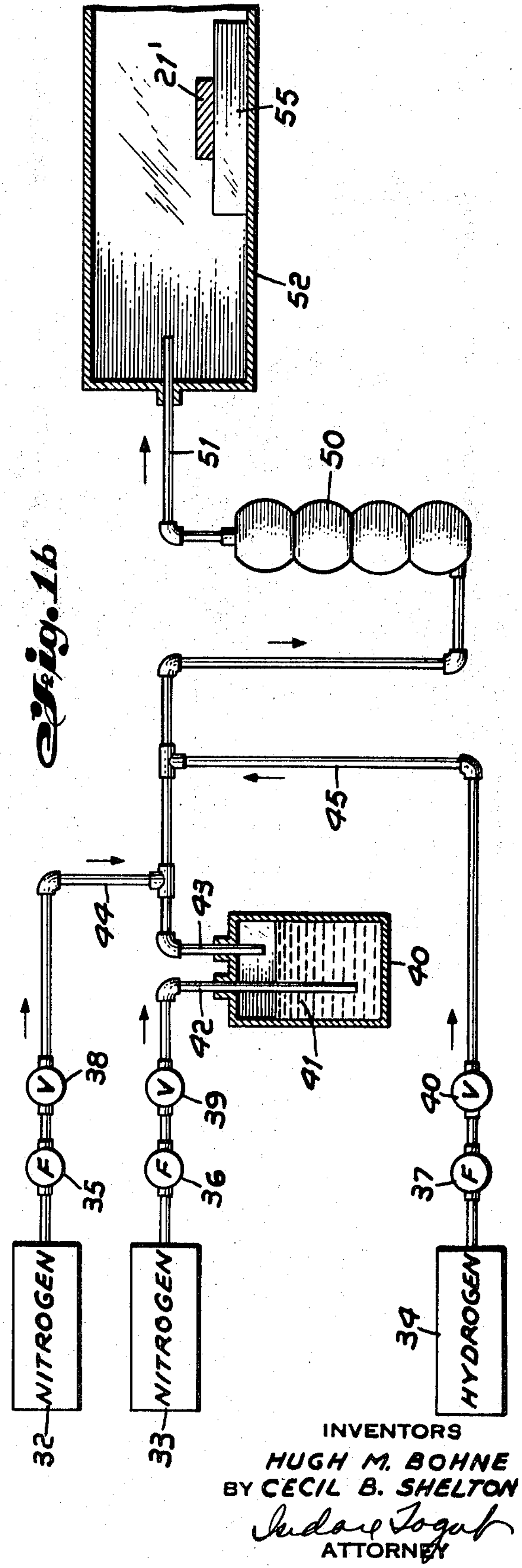

FIGS. 1*a* and 1*b* show a flow diagram for particular apparatus which may be employed in practicing a preferred embodiment of the invention. It should be understood, however, that applicants' invention is directed to a novel process for reducing staining in the vapor-solid diffusion of boron, and that other apparatus which will be evident to those skilled in the art may be employed in the practice of our process.

FIG. 1*a* includes sources of nitrogen carrier gas 22 and 23. Although nitrogen is utilized as the carrier gas and is relatively inert at the temperatures which are utilized in the preferred embodiment hereinafter described, where higher temperatures are employed it may be desirable to utilize a more inert gas such as argon in order to prevent the formation of undesirable nitrogen compounds. Also provided is a source of oxygen gas 24. The gaseous sources 22 and 23 should preferably have an extremely low residual water vapor concentration.

Flow meters 1, 2, and 3 as well as control valves 4, 5, and 6 are inserted in series with the gas sources 22, 23, and 24 respectively. A container 10 holds a liquid 11 comprising boron tribromide through which the nitrogen carrier gas from the source 23 is bubbled. This carrier gas enters the liquid boron tribromide 11 by means of a conduit 7 and emerges therefrom by means of a conduit 8. The conduit 8 therefore contains a saturated mixture of boron tribromide in nitrogen. In our preferred embodiment the flow rate of the nitrogen source 23 as measured by the flow meter 2 is preferably 4 cc. per minute, and the boron tribromide liquid 11 is maintained at room temperature (approximately 70–90° F.). A second source of nitrogen carrier gas 22 enters through a conduit 9 and combines with the boron tribromide-saturated nitrogen gas from the conduit 8. A conduit 15 merges with the conduit 8 to add dry oxygen gas to the boron tribromide-nitrogen composition. The flow rates of the nitrogen gas source 22 and the oxygen gas source 24 are 2 liters per minute and 20 cc. per minute respectively in accordance with our preferred embodiment. The resultant mixture of the constituent gases (now comprising nitrogen, boron tribromide, and oxygen) enters the mixer 16 which produces turbulence mixing of the constituent gases. The mixed gases leave the mixer 16 by means of a conduit 17 and enter the reaction chamber 19 through an aperture 18 therein.

Disposed in the reaction chamber 19 is a silicon slice 21 situated on a support 20. The support 20 and slice 21 are maintained at a temperature of 920° C.–1050° C. and the constituent gases enter the reaction chamber 19 through the conduit 17 and aperture 18 at atmospheric pressure. The process in more detailed steps is as follows: first the furnace tube is preheated at the noted temperature for five minutes with only nitrogen gas; then the impurity mixture of boron tribromide, nitrogen and oxygen is introduced for 30 minutes. The entering gases then react in the hot region adjacent the surface of the silicon slice 21 to deposit a borosilicate glaze containing a relatively high concentration of trapped boron impurities. Finally there is a five minute flush of nitrogen gas only. This produces a surface concentration of approximately $5 \times 10^{19}$ atoms/cc. assuming a normal collector background concentration of $10^{17}$ atoms/cc. With the aforementioned process parameters, the borosilicate glaze is observed to have a rich blue hue and a negligible surface deposit of nonremovable, objectionable stains.

After the borosilicate glaze has been formed by the aforementioned deposition process, the silicon slice 21 is removed from the reaction chamber 19 and placed in a diffusion furnace for the second step of this invention, as shown in FIG. 1*b*, to further diffuse boron impurities from the borosilicate glaze into the surface of the silicon slice 21. The apparatus for this second step includes sources of nitrogen carrier gas 32 and 33 and a source of hydrogen gas 34. Flowmeters 35, 36, and 37 as well as control valves 38, 39, and 40 are inserted in series with the gas sources 32, 33, and 34 respectively. A container 40' holds a liquid 41 comprising boron tribromide through which the nitrogen carrier gas from source 33 is bubbled through conduit 42. The saturated mixture of boron tribromide and nitrogen emerges through conduit 43. Nitrogen gas from the second source enters through conduit 44 and hydrogen gas from source 34 enters through conduit 45. The three gases are then turbulently mixed in mixer 50 and the mixed gases leave mixer 50 by conduit 51, to enter the diffusion chamber 52. The silicon slice 21' after undergoing the borosilicate glass deposition in the reaction chamber 19 is then deposited on support 55 in chamber 52. However before the silicon slice 21' is introducted in the chamber 52 the following procedure is performed at a temperature of 1215° C., 1200 cc./minute of nitrogen gas and 500 cc./minute of hydrogen gas are introduced in chamber 52 for 2 minutes, then for the next 2 minutes 1200 cc./minute of nitrogen gas only is introduced in the chamber 52. After these gases are introduced then boron tribromide gas with hydrogen and nitrogen are introduced for 15 minutes. The following reactions could occur:

$$2BBr_3 \rightarrow 2B + 3Br_2$$

$$H_2 + Br_2 \rightarrow 2HBr$$

$$H_2 + O_2 \rightarrow H_2O$$

The high temperature accompanying these reaction probably would keep them from going to completion thereby increasing reactivity due to disassociated ions. The hydrogen reduction eliminates the undesirable effect on silicon surfaces this higher reactivity could produce in an oxidizing atmosphere. The free bromine and hydrogen bromide are then evacuated from the chamber. The silicon wafer 21 is then introduced into the chamber and remains there at the temperature of 1215° C. for 4 minutes. The quartz furnace tube of chamber 52 is used as an impermeable surface for boron tribromide dissociation to take place. The boron is deposited on the impermeable surface and outgassed therefrom to enrich the borosilicate glass previously formed at 1020° C. The increased temperature increases the solubility of the borosilicate glass, thus getting more boron carriers in the chamber from the dissociation of boron tribromide. No side reaction occurs because the dissociation takes place in a reducing atmosphere. After this diffusion step and subsequent removal of the borosilicate glaze, we have found that the silicon surface exhibits low sheet resistivity between silicon slices processed at different times.

It should be appreciated that the various concentrations and flow rates set forth in our preferred embodiment may be varied to obtain any desired resultant diffusion characteristic.

While the principles of the invention have been described above in connection with specific embodiments, and particular modifications thereof, it is to be clearly understood that this description is made only by way of example and not as a limitation on the scope of the invention.

What we claim is:

1. A process for diffusing boron into a given surface of a silicon semiconductor body comprising the steps of:

passing a decomposable gaseous boron compound and an oxygen containing gaseous compound over said surface while maintaining said surface at a first temperature ranging from approximately 920° C. to 1050° C. such that said compounds react to form a borosilicate glaze on said surface, said decomposable compound liberating a minimum of free boron which at said first temperature is capable of reacting with the silicon at said surface to form an undesired boron-silicon substance;

decomposing said gaseous boron compound in a reducing atmosphere at a second temperature ranging from approximately 1110° C. to 1250° C. to deposit free boron; and heating said body in said reducing atmosphere at said second temperature and for a sufficient time such that said free boron dissolves in said borosilicate glaze and boron from said borosilicate glaze diffuses into said body.

2. A process according to claim 1, wherein said boron compound is selected from the group consisting of a boron halide and diborane.

3. A process according to claim 2, wherein said boron compound is boron tribromide.

4. A process according to claim 1 where said first temperature is approximately 1050° C. and said second temperature on the order of 1215° C.

5. A process according to claim 3 wherein said reducing atmosphere comprises hydrogen gas which reacts with free bromine liberated by decomposition of the boron tribromide to preclude formation of undesirable silicon bromine compounds on said surface.

References Cited

UNITED STATES PATENTS

| | | | |
|---|---|---|---|
| 2,804,405 | 8/1957 | Derick et al. | 148—189 |
| 2,873,222 | 2/1959 | Derick et al. | 148—190 X |
| 3,066,052 | 11/1962 | Howard. | |
| 3,104,991 | 9/1963 | MacDonald | 148—189 X |
| 3,164,501 | 1/1965 | Beale et al. | 148—189 |

L. DEWAYNE RUTLEDGE, Primary Examiner

G. K. WHITE, Assistant Examiner

U.S. Cl. X.R.

148—187, 189, 190